Feb. 10, 1970 I. A. KRAUSE 3,495,180
AMPLITUDE CONTROL CIRCUIT
Filed Dec. 9, 1966
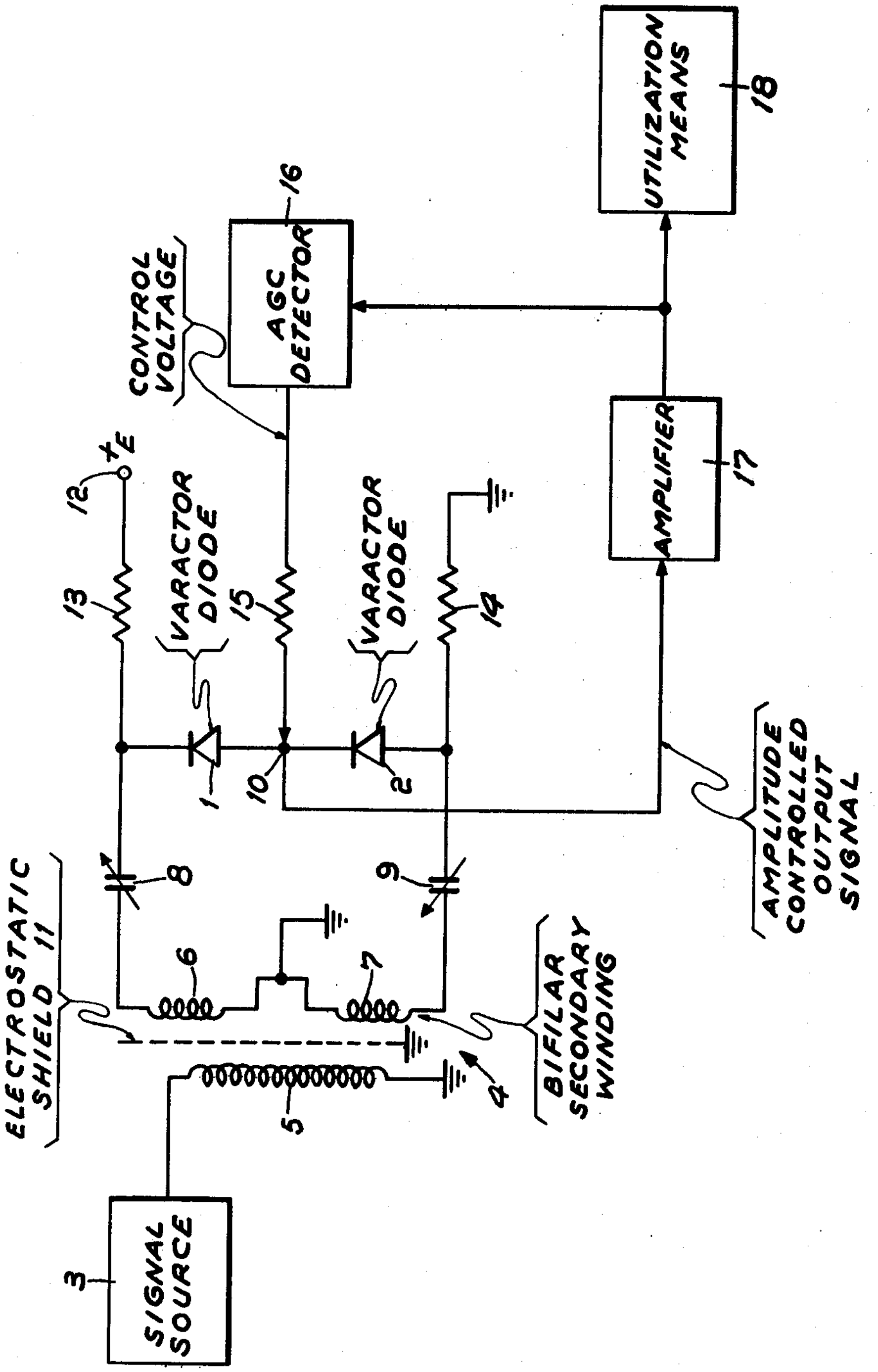
INVENTOR.
IRVING A. KRAUSE
BY Alfred C. Hill
AGENT 3,495,180

AMPLITUDE CONTROL CIRCUIT

Irving A. Krause, Nutley, N.J., assignor to International Telephone and Telegraph Corporation, Nutley, N.J., a corporation of Delaware

Filed Dec. 9, 1966, Ser. No. 600,535
Int. Cl. H03g *3/20*
U.S. Cl. 330—7 5 Claims

ABSTRACT OF THE DISCLOSURE

A first varactor diode having first and second electrodes and second varactor diodes having first and second electrodes are coupled in series relation, both diodes being poled in the same direction, the second electrode of the first diode and the first electrode of the second diode being directly connected together to provide a junction point. An input signal source is coupled in shunt relation to the first and second diodes between the first electrode of the first diode and the second electrode of the second diode. An amplitude controlled version of the input signal is coupled from a junction point as the circuit output signal. A control signal is coupled to the junction point to control the capacitance of the first and second diodes in opposite direction and, hence, the amplitude of the input signal.

This invention relates to amplitude or automatic gain control circuits and more particularly to an amplitude control circuit of the varactor type.

Prior amplitude control circuits have employed an arrangement where the amplitude is controlled by controlling the bias voltage of transistor amplifiers. However, this arrangement produces undesirable side effects, such as detuning.

Another form of prior amplitude control circuits have employed conductive diode type attenuators. This arrangement also has drawbacks particularly with respect to repeater type satellites. First, it is wasteful of power since a relatively large amount of control power is required. Second, it has a high initial or minimum loss. Third, it is not completely devoid of detuning effects.

Therefore, an object of this invention is the provision of variable voltage controlled capacitor or varactor diode amplitude control circuit where the variation of output signal level is achieved by a voltage change with (1) virtually no power being required to operate the device, (2) low initial or minimum losses, and (3) substantially no detuning effects.

A feature of this invention is to provide an amplitude control circuit comprising a first voltage controlled capacitor means, a second voltage controlled capacitor means coupled in series relationship with the first means, third means coupled to the first and second means to apply an input signal thereto, fourth means coupled to the first and second means to apply a control voltage to the first and second means to change their capacitance in opposite directions, and fifth means coupled to the first and second means to provide an amplitude controlled version of the input signal.

The above mentioned and other features and objects of this invention will become more apparent by reference to the following description taken in conjunction with the accompanying drawing, in which the single figure of the drawing is a schematic diagram, partially in block form, of an amplitude control circuit in accordance with the principles of this invention.

Referring to the figure, a voltage controlled capacitor means in the form of varactor diode 1 is coupled in series relation with a second voltage controlled capacitor means in the form of varactor diode 2, diodes 1 and 2 being poled in the same direction. The input signal from source 3 is coupled to the series arrangement of diodes 1 and 2 by means of transformer 4 including primary winding 5 and two secondary windings 6 and 7. One terminal of windings 6 and 7 are grounded. The other terminal of winding 6 is coupled by variable capacitor 8 to one terminal of diode 1. The other terminal of winding 7 is coupled by variable capacitor 9 to one terminal of diode 2. The other terminals of diodes 1 and 2 are directly connected together to provide a junction point 10. Secondary windings 6 and 7, variable capacitors 8 and 9, and diodes 1 and 2 form a bridge or balanced modulator circuit.

Transformer 4 is provided with electrostatic shield 11 and secondary windings 6 and 7 are bifilar in nature to insure wideband balanced circuit operation.

A given value of power supply voltage E is coupled to terminal 12 and through resistor 13 to one terminal of diode 1. One terminal of diode 2 is coupled through resistor 14 to ground potential. Junction point 10 has applied thereto through resistor 15 a control voltage from automatic gain control detector 16.

The amplitude controlled output signal is coupled from junction point 10 to amplifier 17 and, hence, to utilization means 18. Detector 16 can be coupled to the output of amplifier 17 to enable the generation of the control voltage, or it can be connected to another point in the system employing the circuit of this invention which is suitable for generating the desired control voltage.

With the control voltage being coupled to junction point 10 one of diodes 1 and 2 will increase its capacitance as the other of diodes 1 and 2 decrease its capacitance with a given change in control voltage. Capacitors 8 and 9 are adjusted so that when the control voltage is one half the value of voltage E the minimum output signal is achieved thereby resulting in maximum attenuation. Under this condition the circuit is essentially a balanced Wheatstone bridge or lattice. As the control voltage is varied in either direction from the balance point ($E/2$) the attenuation will decrease.

Resistors 13, 14 and 15 are isolation resistors to isolate the DC (direct current) from the RF (radio frequency) voltage thereby preventing the DC control voltage circuits from loading the RF circuits.

In a successful reduction to practice of this circuit, diodes 1 and 2 were varactor diodes having 10 picofarads at 4 volts and voltage E had a value of 15 volts. With a control voltage change of 7 volts there was achieved an attenuation range of 30 db (decibels). It was observed that the bandwidth and shape of the input signal remained constant as the attenuation was varied over this range.

I claim:

1. An amplitude control circuit comprising a series circuit consisting of

- a first voltage controlled capacitor diode having a first terminal coupled to one electrode thereof and a second terminal coupled to the other electrode thereof,
- a second voltage controlled capacitor diode having a first terminal coupled to said one electrode thereof and a second terminal coupled to said other electrode thereof,
- said second terminal of said first diode being directly connected to said first terminal of said second diode providing a junction point,
- a power supply providing a voltage having a given value,
- ground potential,
- a first resistor having one terminal connected directly to said power supply and the other terminal connected directly to said first terminal of said first diode, and a second resistor having one terminal connected directly to said ground potential and the other terminal connected directly to said second terminal of said second diode;

a source of input signal separate from other components of said control circuit;

a transformer having a primary winding coupled between said source and said ground potential and two secondary windings one terminal of each secondary windings being directly connected to said ground potential;

a first capacitor to directly connect the other terminal of one of said secondary windings to said first terminal of said first diode;

a second capacitor to directly connect the other terminal of the other of said secondary windings to said second terminal of said second diode;

said secondary windings, said first and second capacitors, and said first and second diodes providing a bridge circuit;

fourth means coupled to said junction point to apply a control voltage with respect to said ground potential to said first and second diodes to change their capacitance in opposite directions to enable adjustment of the attenuation of said bridge circuit and, hence, the amplitude of said input signal; and fifth means coupled to said junction point to provide with respect to said ground potential and amplitude controlled version of said input signal as an output signal for said control circuit.

2. A circuit according to claim 1, wherein said transformer includes an electrostatic shield disposed between said primary winding and said secondary windings, and a bifilar arrangement of said secondary windings.

3. A circuit according to claim 1, wherein at least one of said first and second capacitors are variable to adjust said bridge circuit for maximum attenuation of said input signal when the value of said control voltage is half way between ground potential and said given value of power supply voltage.

4. A circuit according to claim 3, wherein variation of the value of said control voltage in either direction from said value of said control voltage resulting in maximum attenuation of said input signal will decrease the attenuation of said input signal.

5. A circuit according to claim 1, wherein said fourth means is coupled to the output of said fifth means to provide said control voltage.

References Cited

UNITED STATES PATENTS

| | | | |
|---|---|---|---|
| 3,408,584 | 10/1968 | Miller et al. | 330—9 |
| 2,956,234 | 10/1960 | Olsen | 330—7 X |
| 3,023,378 | 2/1962 | Fuller | 330—7 X |
| 2,848,563 | 8/1958 | Scorgie | 330—7 X |
| 3,400,322 | 9/1968 | Habra | 307—320 X |

FOREIGN PATENTS

| | | |
|---|---|---|
| 753,255 | 7/1956 | Great Britain. |

NATHAN KAUFMAN, Primary Examiner

U.S. Cl. X.R.

330—136